(12) United States Patent
Zhang et al.

(10) Patent No.: US 9,344,040 B2
(45) Date of Patent: May 17, 2016

(54) AMPLIFIER CIRCUIT WITH CROSS WIRING OF DIRECT-CURRENT SIGNALS AND MICROWAVE SIGNALS

(75) Inventors: Bin Zhang, Nanjing (CN); Hongqi Tao, Nanjing (CN)

(73) Assignee: CHINA ELECTRONICS TECHNOLOGY GROUP CORPORATION NO. S5 RESEARCH INSTITUTE, Nanjing (CN)

( * ) Notice: Subject to any disclaimer, the term of this patent is extended or adjusted under 35 U.S.C. 154(b) by 0 days.

(21) Appl. No.: 14/400,542

(22) PCT Filed: Jun. 19, 2012

(86) PCT No.: PCT/CN2012/077137
§ 371 (c)(1),
(2), (4) Date: Nov. 11, 2014

(87) PCT Pub. No.: WO2013/174053
PCT Pub. Date: Nov. 28, 2013

(65) Prior Publication Data
US 2015/0123731 A1    May 7, 2015

(30) Foreign Application Priority Data

May 23, 2012   (CN) .......................... 2012 1 0161486

(51) Int. Cl.
*H03F 3/60* (2006.01)
*H03F 3/68* (2006.01)
*H03F 1/02* (2006.01)
*H01L 23/66* (2006.01)
(Continued)

(52) U.S. Cl.
CPC .............. *H03F 1/0205* (2013.01); *H01L 23/66* (2013.01); *H03F 1/0283* (2013.01); *H03F 1/565* (2013.01); *H03F 3/195* (2013.01); *H03F 3/211* (2013.01); *H03F 3/213* (2013.01);
(Continued)

(58) Field of Classification Search
CPC .............. H03F 3/68; H03F 3/195; H03F 3/60
USPC .......................................... 330/295, 307, 286
See application file for complete search history.

(56) References Cited

U.S. PATENT DOCUMENTS 6,433,639 B1 * 8/2002 Numanami ......... H01L 29/7831
257/E29.119
2006/0118834 A1   6/2006 Ohta et al.
(Continued)

FOREIGN PATENT DOCUMENTS

CN          2849734 Y      12/2006
CN        101453045 A       6/2009
JP       2003289107 A      10/2003

*Primary Examiner* — Steven J Mottola
(74) *Attorney, Agent, or Firm* — Gokalp Bayramoglu

(57) ABSTRACT

Disclosed is an amplifier circuit with cross wiring of direct-current signals and microwave signals. The circuit includes a circuit network unit formed of a direct-current feeding circuit and a microwave power signal circuit. The direct-current feeding circuit comprises a high-electron-mobility transistor (HEMT) drain power-up bonding point, a corresponding line, a feeding end of a tail-level HEMT transistor core, a first Metal-Insulator-Metal (MIM) capacitor, a first micro-strip inductor, symmetrical branch micro-strips, a second MIM capacitors. The microwave power signal circuit comprises a signal end of the tail-level HEMT transistor core, two third MIM capacitors, other electrode of the second MIM capacitors, a ground micro-strip inductors, a second micro-strip inductors, a third micro-strip inductor, a fourth MIM capacitor.

7 Claims, 4 Drawing Sheets

(51) Int. Cl.
*H03F 3/213* (2006.01)
*H03F 3/195* (2006.01)
*H03F 3/21* (2006.01)
*H03F 1/56* (2006.01)

(52) U.S. Cl.
CPC .................. *H01L 2223/6655* (2013.01); *H01L 2924/0002* (2013.01); *H03F 2200/318* (2013.01); *H03F 2200/387* (2013.01)

(56) References Cited

U.S. PATENT DOCUMENTS

2015/0116040 A1\* 4/2015 Miwa ...................... H03F 3/195
330/307
2015/0162876 A1\* 6/2015 Zhang ...................... H03F 3/195
330/307

\* cited by examiner

AMPLIFIER CIRCUIT WITH CROSS WIRING OF DIRECT-CURRENT SIGNALS AND MICROWAVE SIGNALS

FIELD OF THE INVENTION

The present invention relates to an amplifier circuit with cross wiring of direct-current signals and microwave signals, and more particularly to a microwave and millimeter-wave high-power monolithic integrated power amplifier circuit with cross wiring of direct-current signals and microwave signals, and belongs to the field of communications technologies.

DESCRIPTION OF RELATED ART

A microwave and millimeter-wave high-power monolithic integrated power amplifier is a core device in a microwave detection and guidance system and is used for amplifying a low-power signal into a high-power signal, which increases the radiation power of an emitter of the system, thereby increasing a detection distance. With the development of a microwave detection and guidance system, it is required to increase a detection distance and also reduce energy consumption, thereby improving efficiency of the amplifier.

In an aspect, a microwave and millimeter-wave high-power monolithic integrated power amplifier is required to have high output power and high efficiency. In another aspect, during hatch production, to improve consistency and the yield rate and reduce the cost, a chip must be miniaturized.

High-power output requires supply of a large current, and therefore, to bear a large current, a feeding circuit usually has a line width of 100 μm, which is more than twice as large as the width of a signal line, occupies ⅒ of a radial distance of a chip tail-level space, and occupies a large chip area. In addition, the acquisition of high power and high efficiency requires proper matching at an output end. Common T and π matching circuits and several branches of derivative forms thereof are easy to make flexible adjustment in the circuit design and layout for signals in different frequency bands, especially, broadband signals. Due to the limit of the chip size, a microwave and millimeter-wave high-power monolithic integrated power amplifier chip has a very limited wiring space in a tail-level circuit layout.

A tail-level unit in an existing microwave and millimeter-wave high-power monolithic integrated power amplifier has a large grid-width high-electron-mobility transistor (HEMT) transistor core and low output impedance. A typical structure is shown in FIG. 1. A tail-level metal-oxide-semiconductor field-effect transistor (MOSFET) transistor core 150 passes through two mirrored output circuits 101, 102, and reaches an output bonding point 112 after being connected to an inductor 134 in series and connected to a capacitor 135 in parallel. The output circuit 101 includes a bonding pad 111, a capacitor 121, a micro-strip 122, and a matching circuit. The matching circuit includes a capacitor 131 and inductors 132, 133, where a node between the inductors 132, 133 is located on a plate of the capacitor 131, and the matching circuit is matched to an output terminal from this plate (referring to FIG. 2). Facing requirements in the foregoing two aspects, one major difficult problem is to match very low output impedance to 50 ohms; meanwhile, inside a limited chip space, it is nearly impossible to design a feeding circuit and a matching circuit in a proper manner, and it is very difficult to achieve high output power and high efficiency.

SUMMARY OF THE INVENTION

Technical Problem

The objective of the present invention is to propose an amplifier circuit with cross wiring, of direct-current signals and microwave signals by making bold innovation to a tail-level circuit layout in view of the foregoing difficult problems in the prior art, thereby solving the problem of matching from output impedance of a large grid width power chip to a broadband having a high impedance ratio, so as to fully explore the high power and high efficiency performance of a large grid width HEMT transistor core, and meet demands for the current development of microwave detection and guidance systems.

Technical Solution

To achieve the foregoing objective, the basic technical solution of an amplifier circuit with cross wiring of direct-current signals and microwave signals of the present invention includes a circuit network unit formed of a direct-current feeding circuit and a microwave power signal circuit. The direct-current feeding circuit starts from a HEMT drain power-up bonding point, and is connected to a feeding end of a tail-level HEW transistor core via a corresponding line of a tail-level HEMT transistor core combined micro-strip after being connected to a first Mal capacitor in parallel, and connected to a first micro-strip inductor and two symmetrical branch micro-strips in series, the two branch micro-strips being respectively connected to one of electrodes of second mal capacitors in series. The microwave power signal circuit starts from a signal end of a tail-level MOSFET transistor core, is combined into two paths by a corresponding line of a tail-level HEMT transistor core combined micro-strip, the two paths being respectively connected to two third Mal capacitors in parallel, being respectively connected to the other electrode of the second MIM capacitors in series, being respectively connected to ground micro-strip inductors in parallel and respectively connected to second micro-strip inductors in series, and being combined into one path to be connected to a third micro-strip inductor, and is output by a fourth Mal capacitor connected in parallel.

A further improvement in the technical solution of the present invention is that the two electrodes of the second MINI capacitors are distributed in a vertical direction, so as to form a three-dimensional cross between the direct-current feeding circuit and the microwave power signal circuit, and included angles of the cross are preferably 90°.

Yet further improvement in the technical solution of the present invention is that a three-dimensional cross is formed between the combined path in the microwave power signal circuit and one of the two branch micro-strips in the direct-current feeding circuit through an air bridge, and included angles of the cross are preferably 90°.

Another further improvement in the present invention is that two circuit network units are provided and are minor circuits with each other, and outputs of the microwave power signal circuits of the two circuit network units are combined to be connected to a capacitor in parallel to reach a bonding point.

Advantageous Effect

After the foregoing technical solution of the present invention is adopted, it becomes easy to adjust each branch of a matching network, and wiring limitations caused by a fixed position of an intersecting point between a direct-current signal and a microwave power signal no longer exist, so that the tuning allowance of the matching network is reduced. Compared with a conventional solution, the output impedance of a combined port is increased, the difficulty of broadband matching is lowered, the problem of low consistency that occurs because of the discrete process is alleviated, the yield rate during mass production is further improved, and the output power and efficiency of a broadband large grid width microwave and millimeter-wave power amplifier chip are improved. Meanwhile, a chip space utilization rate is improved, heat dissipation performance is improved, and power density is improved.

BRIEF DESCRIPTION OF THE DRAWINGS

The present invention is further described below with reference to the accompanying drawings.

DETAILED DESCRIPTION OF THE INVENTION

Embodiment 1

Figure 3:
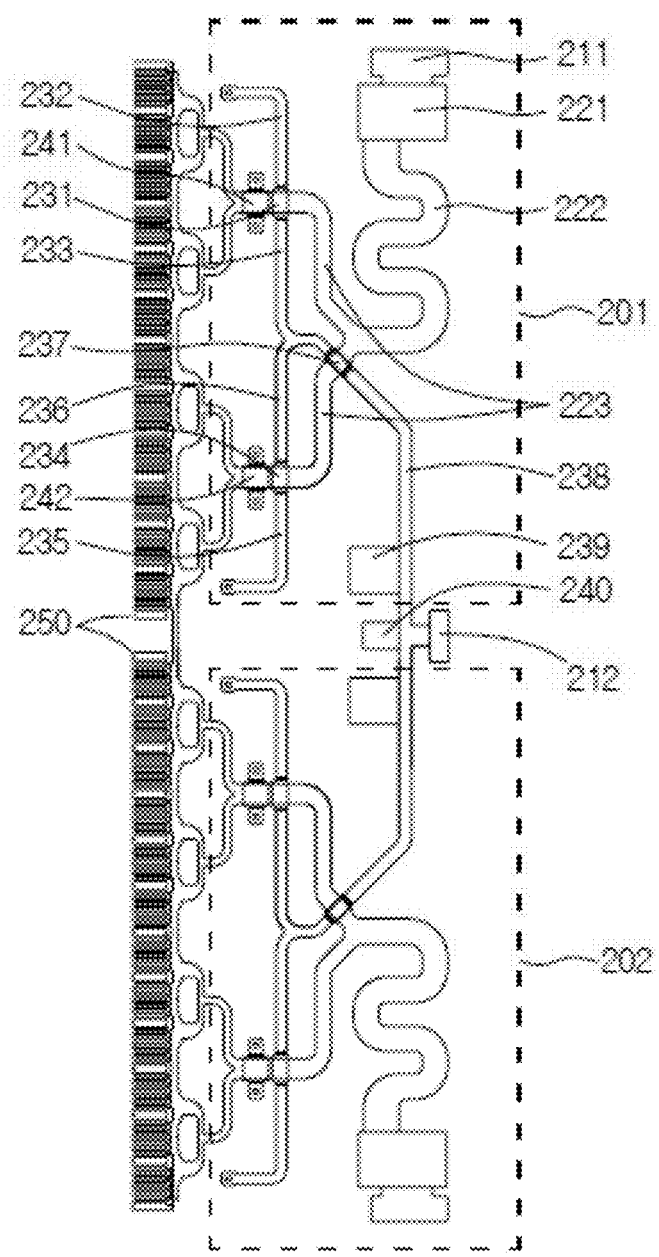
FIG. 3 shows a tail-level circuit layout of a microwave and millimeter-wave high-power monolithic integrated power amplifier according to an embodiment of the present invention.

An amplifier circuit with cross wiring of direct-current signals and microwave signals in this embodiment is shown in FIG. 3, and is formed of two circuit network units 201, 202 that are minor circuits with each other and have microwave power signals consistent in amplitude and phase at every minor point. Each circuit network unit is formed of a direct-current feeding circuit and a microwave power signal circuit. The direct-current feeding circuit starts from a HEMT drain power-up bonding point 211, and is connected to a feeding end of a tail-level HEMT transistor core 250 via a corresponding line of a tail-level HEMT transistor core combined micro-strip after being connected to a first MIM capacitor 221 in parallel, and connected to a first micro-strip indictor 222 and two symmetrical branch micro-strips 223 in series, the two branch micro-strips being respectively connected to one of electrodes of second MIM capacitors 231, 234 in series. The microwave power signal circuit starts from a signal end of the tail-level HEMT transistor core 250, is combined into two paths by a corresponding line of a tail-level HEMT transistor core combined micro-strip formed of a group of unit cell transistors, the two paths being respectively connected to two third Mal capacitors 241, 242 in parallel, being respectively connected to the other electrode of the second MIM capacitors 231, 234 in series, being respectively connected to ground micro-strip inductors 232, 235 in parallel and respectively connected to second micro-strip inductors 233, 236 in series, and being combined into one path to be connected to a third micro-strip inductor 238, and is output to a fourth Mal capacitor 239 connected in parallel to be combined to a capacitor 240 connected in parallel to reach a bonding point 212 eventually. Because the two electrodes of the foregoing second MIM capacitors are distributed in a vertical direction, a three-dimensional cross between the direct-current feeding circuit and the microwave power signal circuit is formed, and included angles of the cross are 90°. In addition, a three-dimensional cross is formed between the combined path in the microwave power signal circuit and one of the two branch micro-strips in the direct-current feeding circuit through an air bridge 237, and included angles of the cross are also 90°.

In the circuit units 201, 202, a direct-current feeding signal is transmitted in a transverse direction on a chip, and a microwave power signal is transmitted in an axial direction: such a circuit wiring manner may reduce crosstalk influence on a microwave power signal from noise that has various frequency components and is from a direct-current power source. The direct-current feeding circuit and the microwave power signal circuit have at least 6 crosses, which are respectively located at the MIM capacitors 231, 234 and the air bridge 237 in the circuit unit 201 and corresponding parts in the minor circuit unit 202. For a circuit chip, a working frequency band, power, efficiency, consistency, a yield rate, and cost are taken into comprehensive consideration; the wafer in the chip uses a GaAs or GaN material as a substrate; however, the present invention is not only limited thereto.

It is proved through theory and tests that this embodiment has the following advantageous effects:

1) It becomes easy to adjust the feature length and feature width of branches in a matching network, for example, micro-strips 232, 233, 223, 222, 238; wiring limitations caused by a fixed position of an intersecting point between a direct-current signal and a microwave power signal, for example, the micro-strips 122, 132, 133 intersecting at the capacitor node 131, no longer exist, so that the tuning allowance of the matching network is increased.

Figure 1:
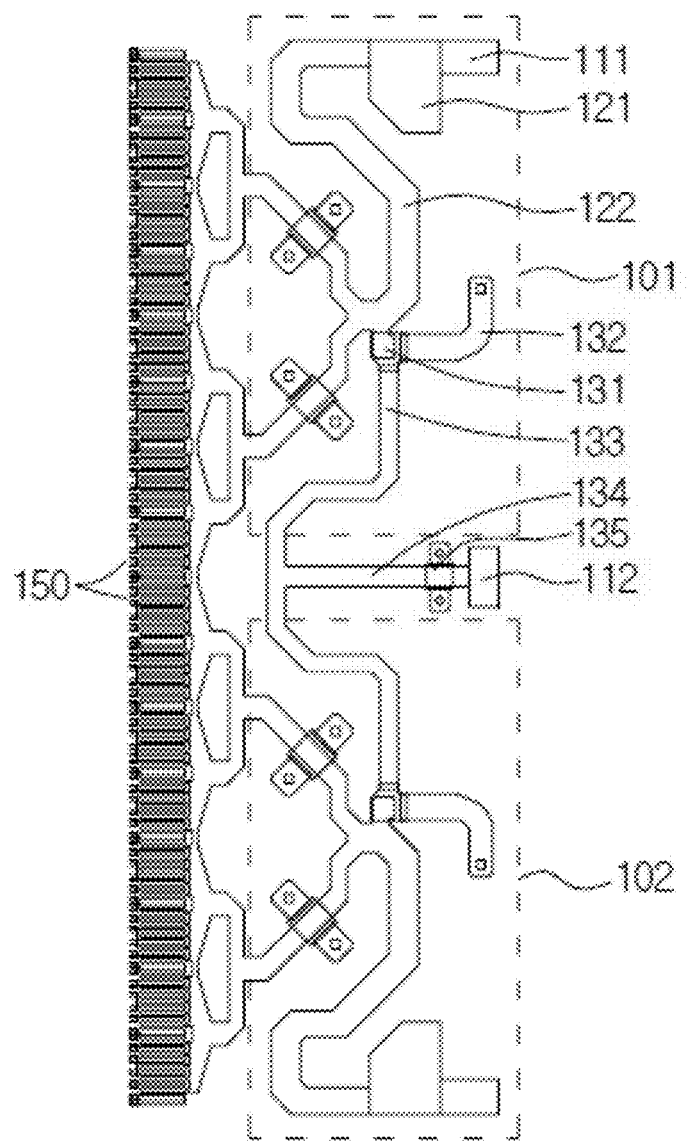
FIG. 1 shows a tail-level circuit layout of a microwave and millimeter-wave high-power monolithic integrated power amplifier in the prior art.
Figure 2:
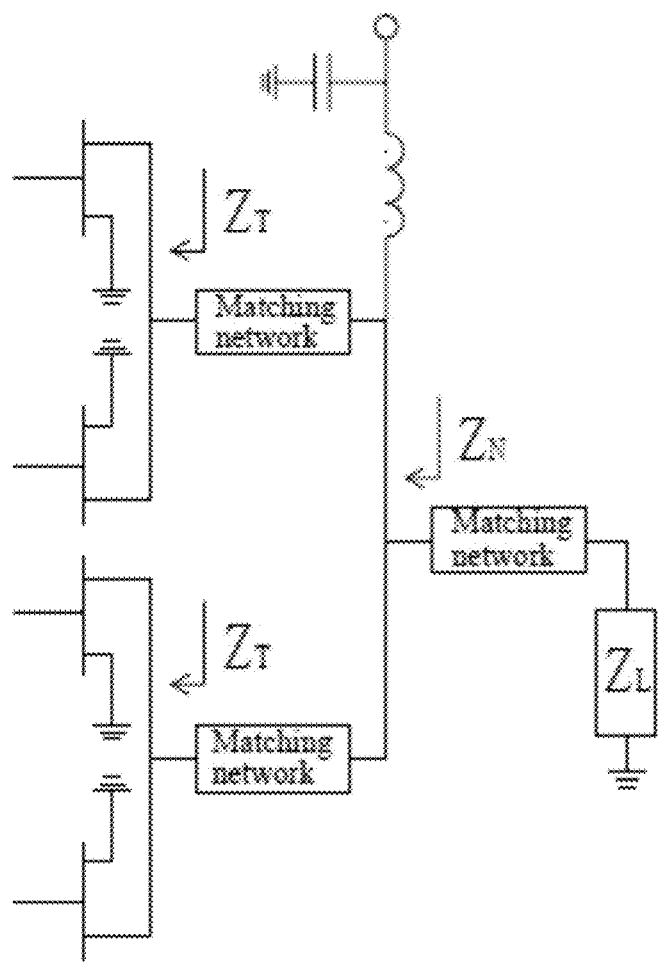
FIG. 2 is a schematic diagram of a tail-level matching circuit of a microwave and millimeter-wave high-power monolithic integrated power amplifier in the prior art.
Figure 4:
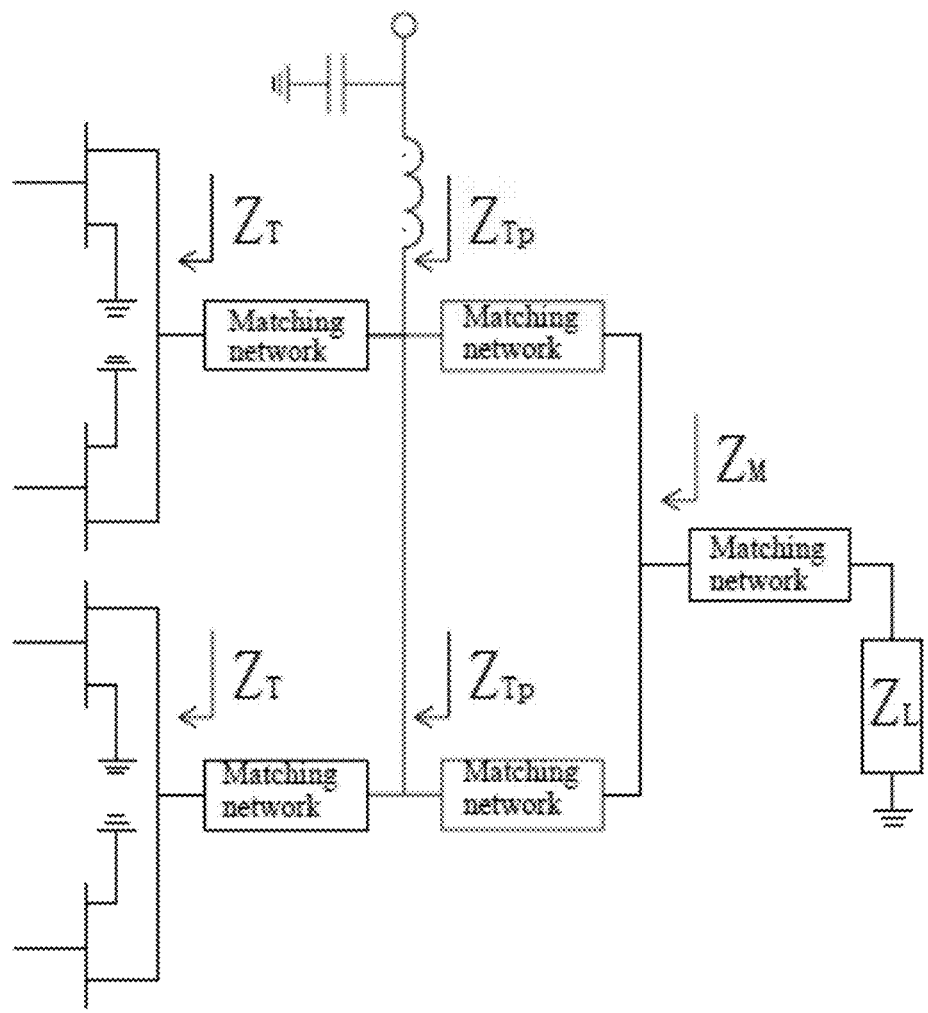
FIG. 4 is a schematic diagram of a tail-level matching circuit of a microwave and millimeter-wave high-power monolithic integrated power amplifier according to an embodiment of the present invention.

2) A few HEMT transistor cores are combined first, pre-matching is performed once on this combined port to increase output impedance to a certain level, matching is then performed another time to perform two times of combination on two combined ports after two times of matching, and the port after two times of combination is matched to 50 ohms through a third network. Compared with a conventional solution, this embodiment improves the output impedance of a combined port (referring to FIG. 2, and FIG. 4), shrinks the matching prohibited area, lowers the difficulty of broadband matching, alleviates the problem of low consistency that occurs because of the discrete process, thither improves a yield rate during mass production, and improves output power and efficiency of a broadband large grid width microwave and millimeter-wave power amplifier chip.

3) A chip space utilization rate is improved, heat dissipation performance is improved, and power density is improved.

In sum, this embodiment solves the difficult problem of matching from the output impedance of the large grid width power chip to a broadband having a high impedance ratio and a 50-ohm port, so as to fully explore high power and high efficiency performance of a large grid width HEMT transistor core.

What is claimed is:

1. An amplifier circuit with cross wiring of direct-current signals and microwave signals, comprising a circuit network unit formed of a direct-current feeding circuit and a microwave power signal circuit, wherein the direct-current feeding circuit starts from a high-electron-mobility transistor (HEMT) drain power-up bonding point (211), and is connected to a feeding end of a tail-level HEMT transistor core (250) via a corresponding line of a tail-level HEMT transistor core combined micro-strip after being connected to a first Metal-Insulator-Metal (MIM) capacitor (221) in parallel, and connected to a first micro-strip inductor (222) and two symmetrical branch micro-strips (223) in series, the two symmetrical branch micro-strips being respectively connected to one of electrodes of second MIM capacitors (231, 234) in series; and the microwave power signal circuit starts from a signal end of the tail-level HEMT transistor core (250), is combined into two paths by a corresponding line of a tail-level HEMT transistor core combined micro-strip, the two paths being respectively connected to two third MIM capacitors (241, 242) in parallel, being respectively connected to the other electrode of the second MaI capacitors (231, 234) in series, being respectively connected to ground micro-strip inductors (232, 235) in parallel and respectively connected to second micro-strip inductors (233, 236) in series, and being combined into one path to be connected to a third micro-strip inductor (238), and is output by a fourth MIM capacitor (239) connected in parallel.

2. The amplifier circuit with cross wiring of direct-current signals and microwave signals according to claim 1, wherein the two electrodes of the second MIM capacitors are distributed in a vertical direction so as to form a three-dimensional cross between the direct-current feeding circuit and the microwave power signal circuit.

3. The amplifier circuit with cross wiring of direct-current signals and microwave signals according to claim 1, wherein a three-dimensional cross is formed between the combined path in the microwave power signal circuit and one of the two branch micro-strips in the direct-current feeding circuit through an air bridge (237).

4. The amplifier circuit with cross wiring of direct-current signals and microwave signals according to claim 3, wherein all included angles of the three-dimensional cross are 90°.

5. The amplifier circuit with cross wiring of direct-current signals and microwave signals according to claim 4, wherein two circuit network units are provided and are mirror circuits with each other, and outputs of the microwave power signal circuits of the two circuit network units are combined to be connected to a capacitor (240) in parallel to reach a bonding point (212).

6. The amplifier circuit with cross wiring of direct-current signals and microwave signals according to claim 5, wherein the tail-level HEMT transistor core combined micro-strip is formed of a group of unit cell transistors.

7. The amplifier circuit with cross wiring of direct-current signals and microwave signals according to claim 2, wherein a three-dimensional cross is formed between the combined path in the microwave power signal circuit and one of the two branch micro-strips in the direct-current feeding circuit through an air bridge (237).

* * * * *